United States Patent
Celant et al.

[11] Patent Number: 6,141,313
[45] Date of Patent: Oct. 31, 2000

[54] INTEGRATED CIRCUIT WITH TWO PHASE-LOCKED LOOPS AND CIRCUIT FOR PREVENTING LOCKING OWING TO INJECTION

[75] Inventors: Luca Celant, Milan; Marco De Micheli, Binago; Melchiorre Bruccoleri, Rho; Luca Rigazio, Cigliano, all of Italy

[73] Assignee: STMicroelectronics S.r.l., Agrate Brianza, Italy

[21] Appl. No.: 09/113,576

[22] Filed: Jul. 10, 1998

[30] Foreign Application Priority Data

Jul. 14, 1997 [EP] European Pat. Off. .............. 97830351

[51] Int. Cl.[7] .................................................. G11B 7/00
[52] U.S. Cl. ................... 369/124.1; 369/124.14; 369/53; 369/48; 360/51
[58] Field of Search ........................... 369/124.1, 124.14, 369/54, 56, 53, 48, 47

[56] References Cited

U.S. PATENT DOCUMENTS

| | | | |
|---|---|---|---|
| 5,172,357 | 12/1992 | Taguchi | 369/48 |
| 5,359,298 | 10/1994 | Abe | 331/2 |
| 5,414,390 | 5/1995 | Kovacs et al. | 331/2 |

FOREIGN PATENT DOCUMENTS

| | | |
|---|---|---|
| 0 654 907 A1 | 5/1995 | European Pat. Off. . |
| 0 663 744 A1 | 7/1995 | European Pat. Off. . |

*Primary Examiner*—Nabil Hindi
*Attorney, Agent, or Firm*—Theodore E. Galanthay; Robert Iannucci; Seed IP Law Group PLLC

[57] ABSTRACT

An integrated circuit including two phase-locked loops each with its own oscillator. To prevent locking owing to injection between the two oscillators due to stray currents in the integrated circuit, a noise generator is coupled to the oscillator of one of the loops and a timer is provided for activating the noise generator in a manner such that the noise generated changes the frequency of the oscillator randomly when the other loop is in operation.

20 Claims, 7 Drawing Sheets

INTEGRATED CIRCUIT WITH TWO PHASE-LOCKED LOOPS AND CIRCUIT FOR PREVENTING LOCKING OWING TO INJECTION

TECHNICAL FIELD

The present invention relates to an integrated circuit having two phaselocked loops each with its own oscillator.

BACKGROUND OF THE INVENTION

Integrated circuits with two phase-locked loops, or PLLs, are used in reading and writing devices in data-storage disk units.

FIG. 1 shows schematically a system for recovering data coming from a read head of a disk unit. The flow of data to be recovered, indicated by D-IN, is supplied to a data-recovery block D-REC and, by means of a switch SW, to a PLL block, indicated R-PLL, comprising an oscillator OSC-1. The block R-PLL has the function of sampling the flow of data D-IN so as to digitize the analog data coming from the head and thus generate an output sampling signal R-CLK for the data-recovery block D-REC. The digitized data-flow appears at the output D-OUT. Before the start of the data-recovery operation, the block R-PLL is caused to oscillate at a frequency very close to that necessary for reading the track of the disk which contains the data D-IN, by a connection to a terminal, indicated TUN, of a synthesizer block W-PLL, by means of the switch SW. The switch SW is brought from one position to the other alternately at predetermined intervals by suitable timing means TM.

The synthesizer block W-PLL comprises a second PLL with an oscillator OSC-2 which generates, from a constant reference signal FREF, preferably supplied by a quartz oscillator outside the integrated circuit, a certain number of signals of different frequencies amongst which is a timing signal at the terminal TUN, which is used both for writing data on the disk and for the above-described tuning operation.

A problem which arises owing to the presence of the oscillators of the two PLLs in the same integrated circuit is so-called "injection lock" which is due to a coupling between the two oscillators caused by stray currents in the substrate of the integrated circuit and by interference present in the supply voltages of the integrated circuit. In the case described above, when the frequency of the oscillator OSC-1 of the block R-PLL, that is, the reading PLL, is close to that of the signal TUN synthesized by the block W-PLL, the oscillator OSC-1 of the reading PLL R-PLL is locked by the oscillator OSC-2 of the synthesizer block W-PLL, that is, its frequency remains constant when the current for regulating the oscillator varies within a predetermined range around the regulation value corresponding to that frequency. This phenomenon worsens the signal/noise ratio of the system since the input data-flow is sampled at the wrong moments.

SUMMARY OF THE INVENTION

According to principles of the present invention, a circuit is provided having structural and functional characteristics for preventing injection lock in an integrated circuit with two oscillators. Specifically, a circuit according to an embodiment of the present invention is provided with two oscillators and a noise generator circuit. The noise generator circuit may be coupled to a circuit with one of the oscillators and a circuit for activating the noise generator circuit when a circuit with the other oscillator is in operation. The circuit according to the embodiment of the present invention may be employed to recover data from a read head in a memory storage device.

DETAILED DESCRIPTION OF THE INVENTION

Figure 1:
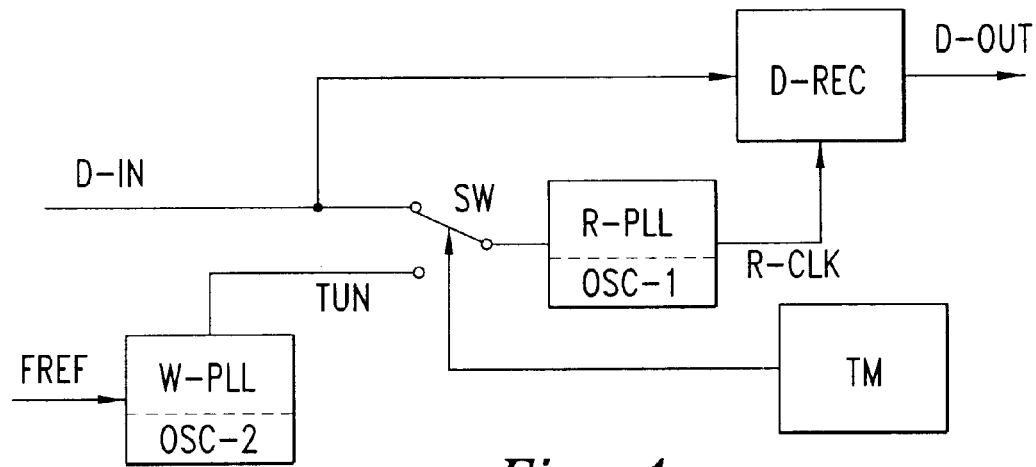
FIG. 1 is a block diagram of a portion of a known integrated circuit for recovering data in a disk unit.
Figure 2:
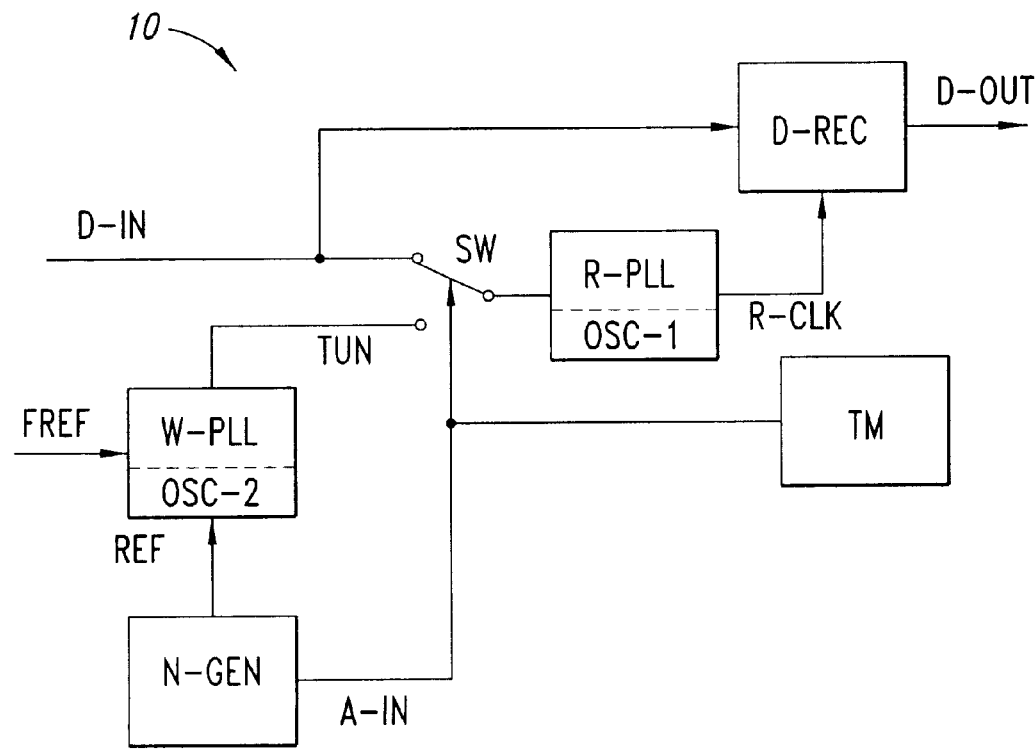
FIG. 2 is a block diagram of a portion of an integrated circuit according to an embodiment of the present invention for recovering data in a disk unit.

A circuit 10 for recovering data from a read head in a disk unit according to an embodiment of the present invention is shown in FIG. 2. The circuit 10 of FIG. 2 contains blocks similar in structure and operation to corresponding blocks shown in the circuit of FIG. 1, and the similar blocks have been given the same reference symbols for purposes of brevity. The circuit 10 includes a noise generator NGEN connected to the oscillator OSC-2 of the synthesizer block W-PLL at a terminal indicated REF. The noise generator N-GEN can act on the components which determine the frequency of the oscillator OSC-2 and is activated by the timer TM by an enabling signal, indicated A-IN, when the switch SW is in the position indicated, that is, when the block R-PLL is connected to the line carrying the data D-IN and is therefore performing its function of generating the sampling signal R-CLK. The noise generated by the noise generator N-GEN has a wide spectrum and interferes with the oscillator OSC-2, causing an irregular and substantially random shift from its oscillation frequency fo, which is fixed by the regulation current of the oscillator, throughout the time during which the generator N-GEN is activated.

Figure 3:
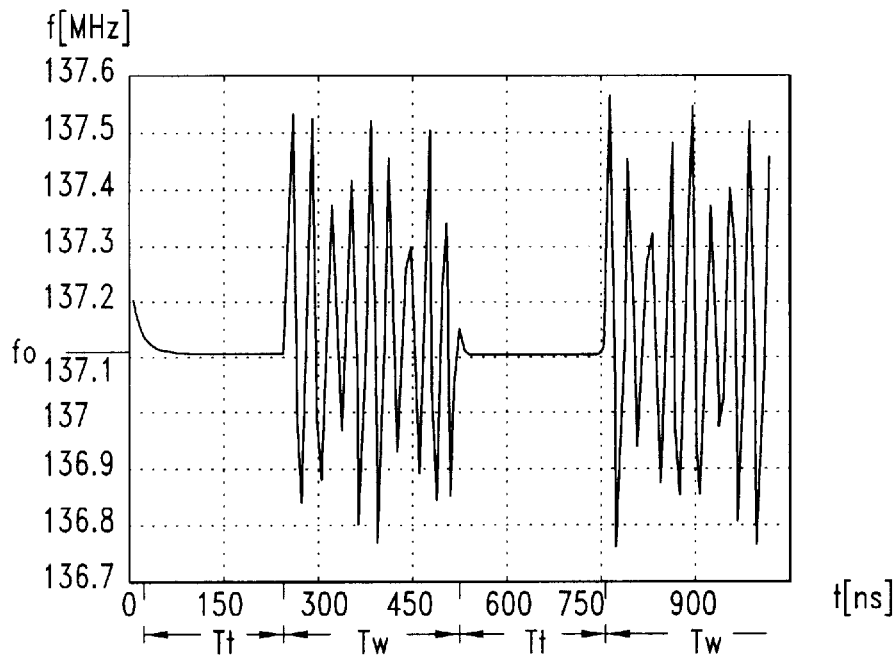
FIG. 3 is a graph showing how the frequency of an oscillator of the integrated circuit of FIG. 2 varies.

This behaviour is shown in the graph of FIG. 3, in which it can be seen how the frequency of the oscillator OSC-2 varies as a function of time. When the switch SW is in the position in which the reading PLL R-PLL is connected to the tuning output TUN of the block W-PLL in order to be tuned to a frequency close to that necessary for reading the track of the disk which contains the data D-IN, that is, during the tuning time intervals Tt which, in this example, are of 200 ns, the oscillator OSC-2 oscillates without interference at the frequency fo set by the regulation current. When the switch SW connects the reading PLL R-PLL to the data line D-IN in order to generate the sampling signal R-CLK, however, the frequency of the oscillator OSC-2 is shifted from the frequency fo in a pulsed and irregular manner. During these time intervals, indicated Tw, which are of 300 ns in this example, the reading PLL R-PLL can perform its function without the risk of "locking" with the oscillator OSC-2 precisely because of the instability of the frequency of the oscillator OSC-2.

Figure 4:
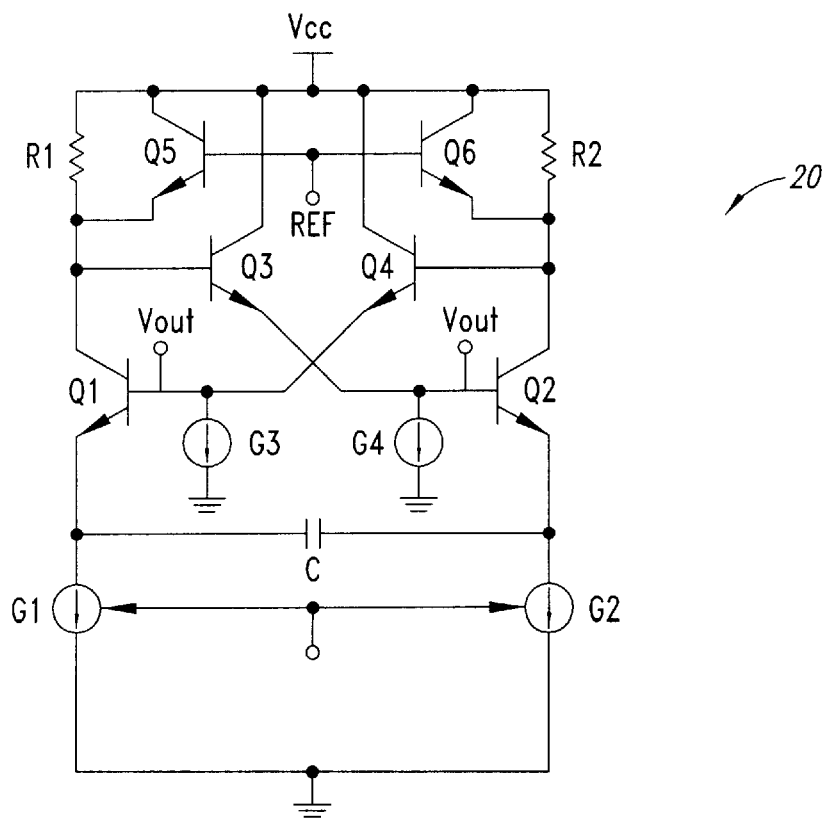
FIG. 4 is a circuit diagram of an oscillator used in the integrated circuit of FIG. 2 according to an embodiment of the present invention.

An oscillator 20 used in the synthesizer block W-PLL according to an embodiment of the present invention is shown in FIG. 4. The oscillator 20 includes an astable multivibrator comprising two circuit branches with respective npn bipolar transistors Q1 and Q2 having their collectors connected to a first supply terminal Vcc by means of respective resistors R1, R2 and their emitters connected to a second supply terminal, indicated by the ground symbol, by means of respective controllable currentgenerators G1 and G2. The transistors Q1 and Q2 have their emitters coupled to one another by means of a capacitor C and are cross-coupled, that is, each has its collector connected to the base of the other by means of a respective npn transistor Q3 or Q4. More precisely, the collectors of the transistors Q3 and Q4 are connected to the terminal Vcc, their bases are connected to the collectors of Q1 and Q2, respectively, and their emitters are connected to the bases of Q2 and Q1, respectively, as well as to the ground terminal by means of respective constant-current generators G4 and G3. The emittercollector path of a respective npn transistor Q5 or Q6 is connected in parallel with each of the resistors R1 and R2. The transistors Q5 and Q6 have their bases connected to one another and to a terminal, indicated REF, for connection to a reference-voltage supply and constitute, with the associated resistors R1 and R2, variable impedances in series with the two circuit branches of the multivibrator. In operation, as a result of the positive feedback brought about by the transistors Q3 and Q4, the two transistors Q1 and Q2 change alternately from the conducting to the cut-off state at a frequency determined by the capacitance of the capacitor C, by the current of the generators G1 and G2, and by the voltage at the terminal REF.

At the output terminals Vout of the circuit, that is, in this embodiment, at the bases of the transistors Q1 and Q2, there are therefore voltage signals constituted by complementary square waves of frequency f—I4CVref, where I is the current of the generators G1 and G2 and Vref is the voltage at the terminal REF. The voltage Vref is normally supplied by a temperature-independent constant-voltage supply.

Figure 5:
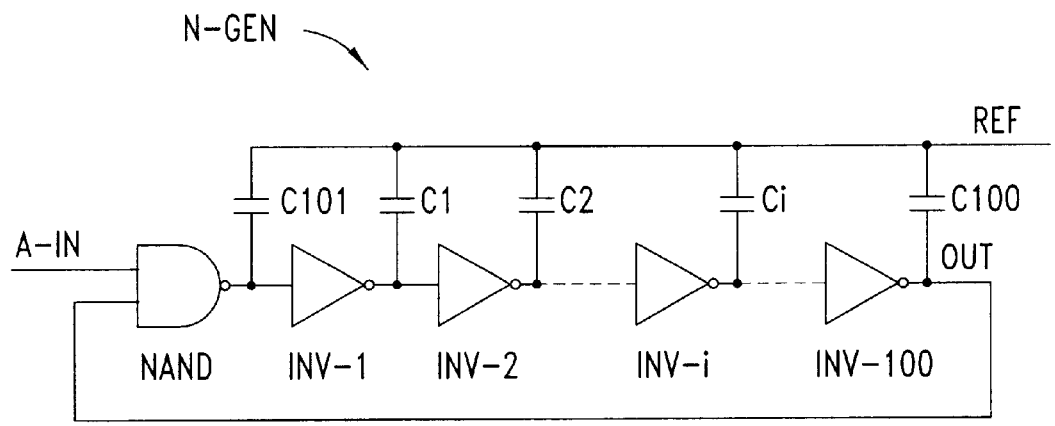
FIG. 5 is a block diagram showing a noise generator used in the integrated circuit of FIG. 2 according to an embodiment of the present invention.

A noise generator N-GEN usable in the circuit according to the embodiment of the present invention shown in FIG. 2 is shown in FIG. 5. It is a conventional loop oscillator formed by an odd number of inverting delay cells, in this embodiment one hundred inverters indicated INV-1, INV-2, . . . , INV-i, . . . , INV-100 and a NAND logic gate with two inputs. The output of each cell INV-i is connected to the input of the next. The cell INV-100 has its output connected to an input of the NAND logic gate. The second input of the NAND gate, indicated A-IN, constitutes the terminal which receives the enabling signal A-IN from the timer TM. The noise generator N-GEN is enabled by the timer TM only when data D-IN is entering the reading PLL R-PLL.

As is known, a loop oscillator such as that shown in FIG. 5 generates a square-wave signal the frequency of which is determined by the propagation delays of the cells which, in turn, depend on the capacitances associated with the individual cells.

This signal is present at the outputs of all of the delay cells, naturally with alternately opposite signs and with a delay determined by the delay time of the preceding cell in each case.

The signals present at the outputs of the delay cells INV-i are picked up by means of capacitors C1, . . . Ci, . . . , C101 with capacitances much lower than the capacitances which determine the delays of the cells, and are applied to the terminal REF of the oscillator OSC-2 of the synthesizer block W-PLL. Each of the capacitors C1 to C101 constitutes, together with the input resistance of the oscillator OSC-2 at the terminal REF, a differentiating circuit which generates pulses corresponding to the leading and trailing edges of the square wave of the signal present at the output of the respective cell INV-i.

The capacitances are preferably all different (and, for example, between 8 and 12 pF) so that the widths of the pulses generated from time to time are different. A voltage variable in a very irregular manner is thus obtained at the terminal REF and, as shown in FIG. 3, constitutes interference for the oscillator OSC-2 of the synthesizer block W-PLL. In the presence of this interference, the oscillator OSC-2 cannot influence the operation of the oscillator OSC-1 of the reading PLL R-PLL. Upon completion of the reading operation, that is, when the switch SW breaks the connection between R-PLL and D-IN and makes the connection between R-PLL and the terminal TUN of the synthesizer block W-PLL, the enabling signal A-IN input to the NAND gate of the noise generator N-GEN changes state, interrupting the operation of the loop oscillator and hence the interference to the oscillator OSC-2 of the synthesizer block WPLL.

It should be noted that, during the writing stage, that is, when the synthesizer block W-PLL is in operation, the oscillator OSC-1 of the reading PLL RPLL is switched off and does not therefore interfere with the operation of the oscillator OSC-2.

Moreover, during the reading stage, when the oscillator OSC-2 is subject to interference by the noise generator, the synthesizer block W-PLL is inactive so that the interference of the oscillator OSC-2 does not cause any problem in the operation of the system as a whole.

Figure 6:
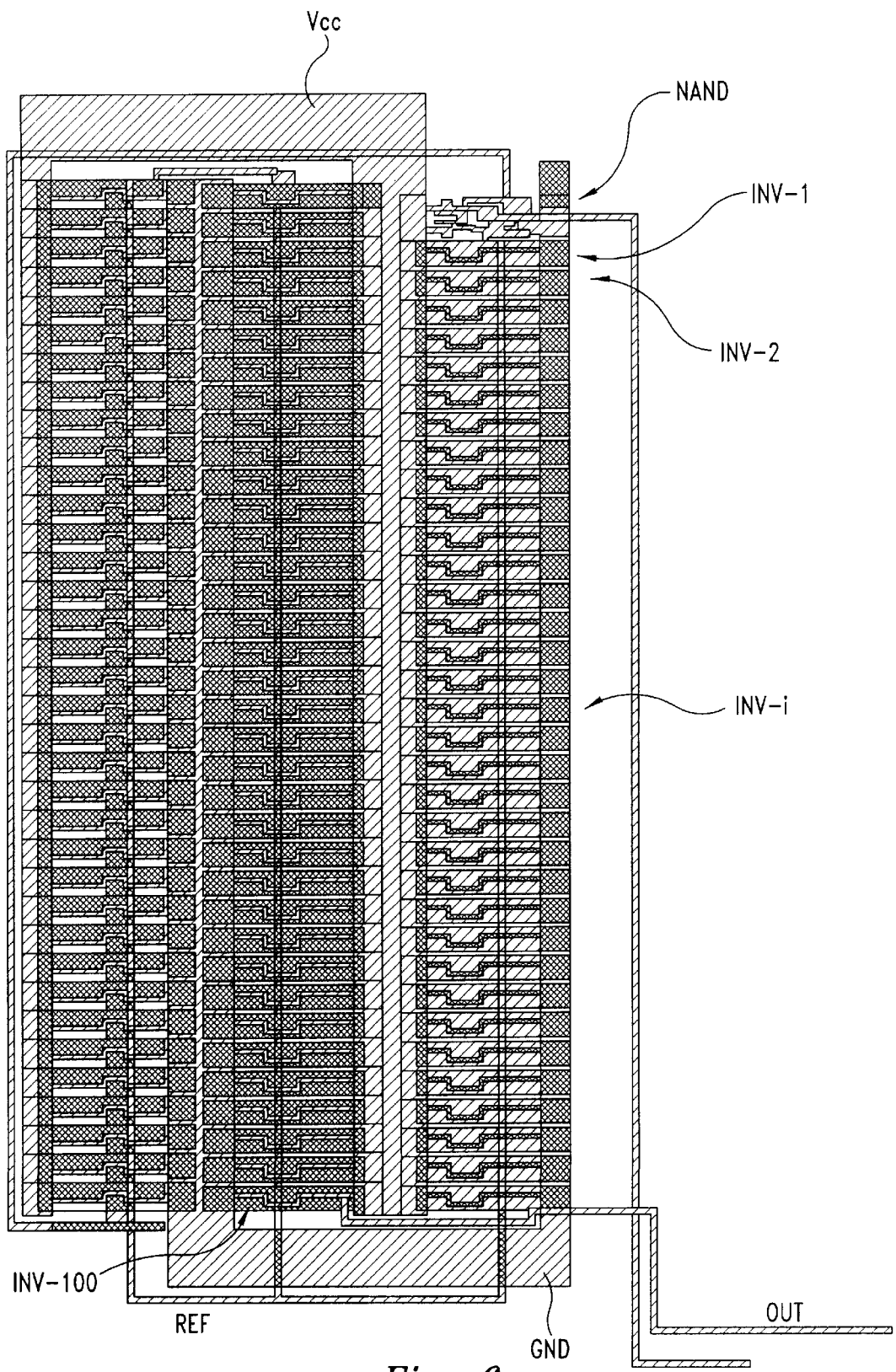
FIG. 6 shows the layout of a noise generator in an integrated circuit of the type illustrated in the diagram of FIG. 5 according to an embodiment of the present invention.

The noise generator N-GEN can be formed in a very small area of an integrated circuit with a topography or "layout" such as that shown in FIG. 6 according to an embodiment of the present invention. An oscillator of this type is usually already present in the integrated circuit for diagnostic purposes (particularly for deriving data on some process parameters such as stray capacitances and threshold voltages). Shown in the layout of FIG. 6 is a track corresponding to the input terminal A-IN, a track corresponding to the output terminal OUT used for controlling the operation of the oscillator when it is performing diagnostic functions, a track for connection to the terminal REF of the oscillator OSC-2 and therefore also indicated REF, and two supply terminals, indicated Vcc and GND. An area containing the NAND logic gate and one hundred rectangular areas side by side and arranged in three parallel rows, which contain the inverting delay cells INV-1, INV-2, . . . , NV-i, . . . , INV-100 are also shown.

Figure 7:
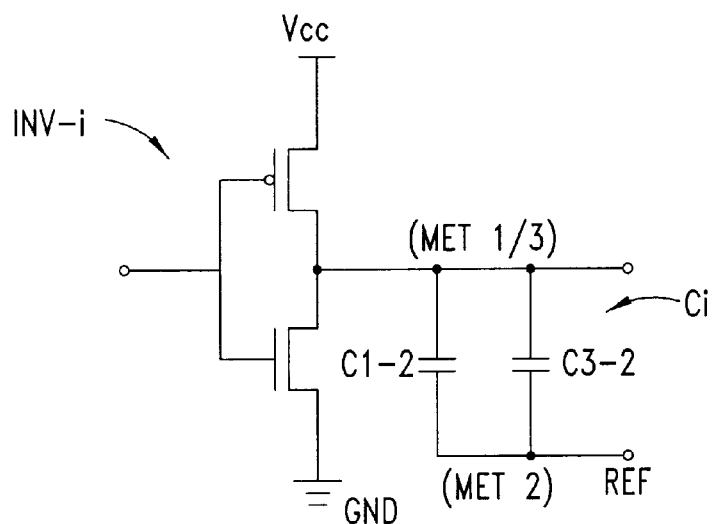
FIG. 7 is a circuit diagram of a delay cell of the noise generator of FIG. 5 according to an embodiment of the present invention.

Each delay cell INV-i is an inverter comprising two CMOS transistors connected as shown in the electrical diagram of FIG. 7 according to an embodiment of the invention between two supply terminals Vcc and GND and with its output connected to the terminal REF by means of two capacitors C1-2 and C3-2 in parallel which together represent the generic capacitance Ci of FIG. 5. These capacitors are advantageously formed with the use of three metallization layers formed at three different levels, insulated from one another, and indicated MET1, MET2, and MET3 in FIGS. 8, 9 and 10.

Figure 8:
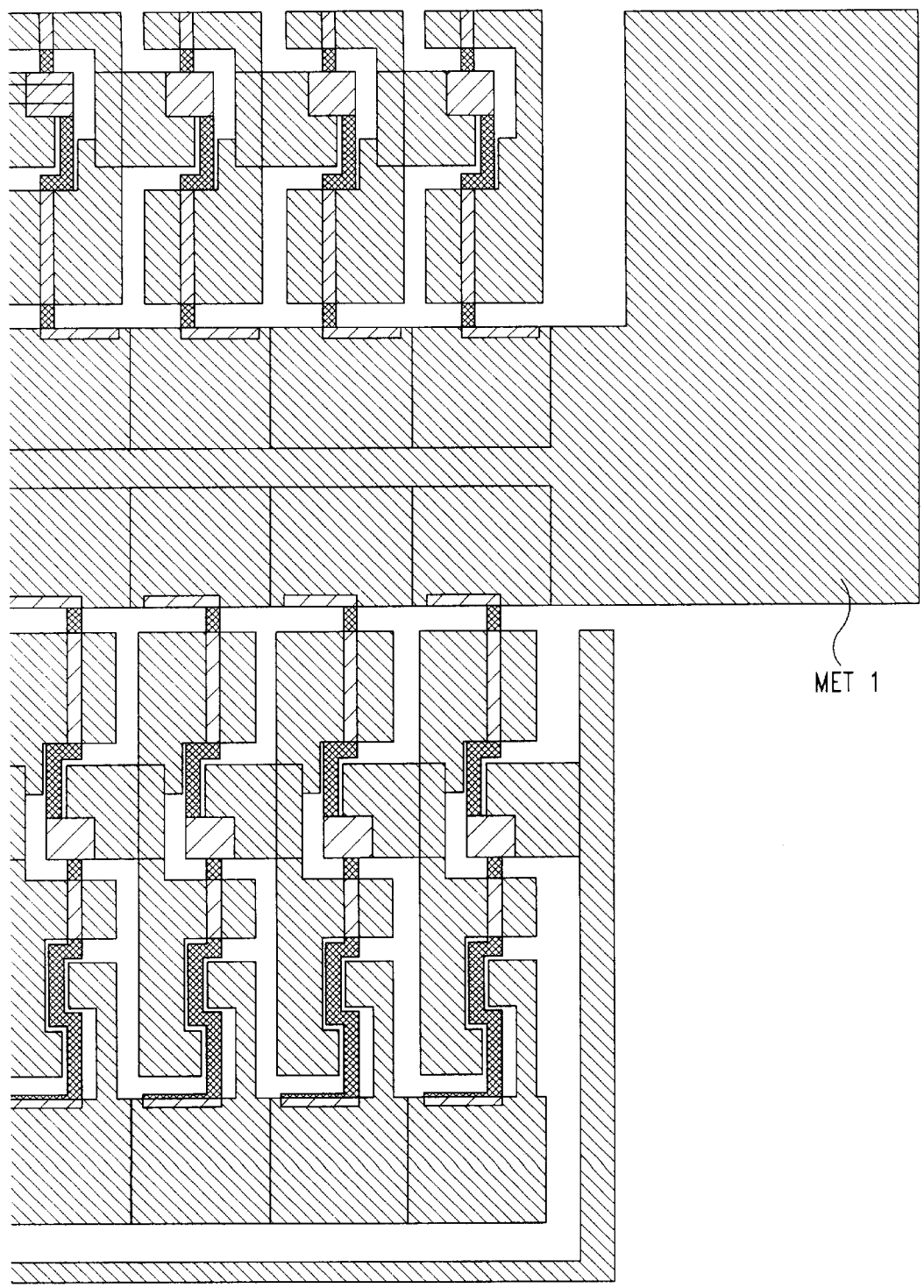
FIGS. 8, 9 and 10 show details of the layout of the noise generator shown in FIG. 6 on an enlarged scale, at three stages of a process for the manufacture of the integrated circuit.
Figure 9:
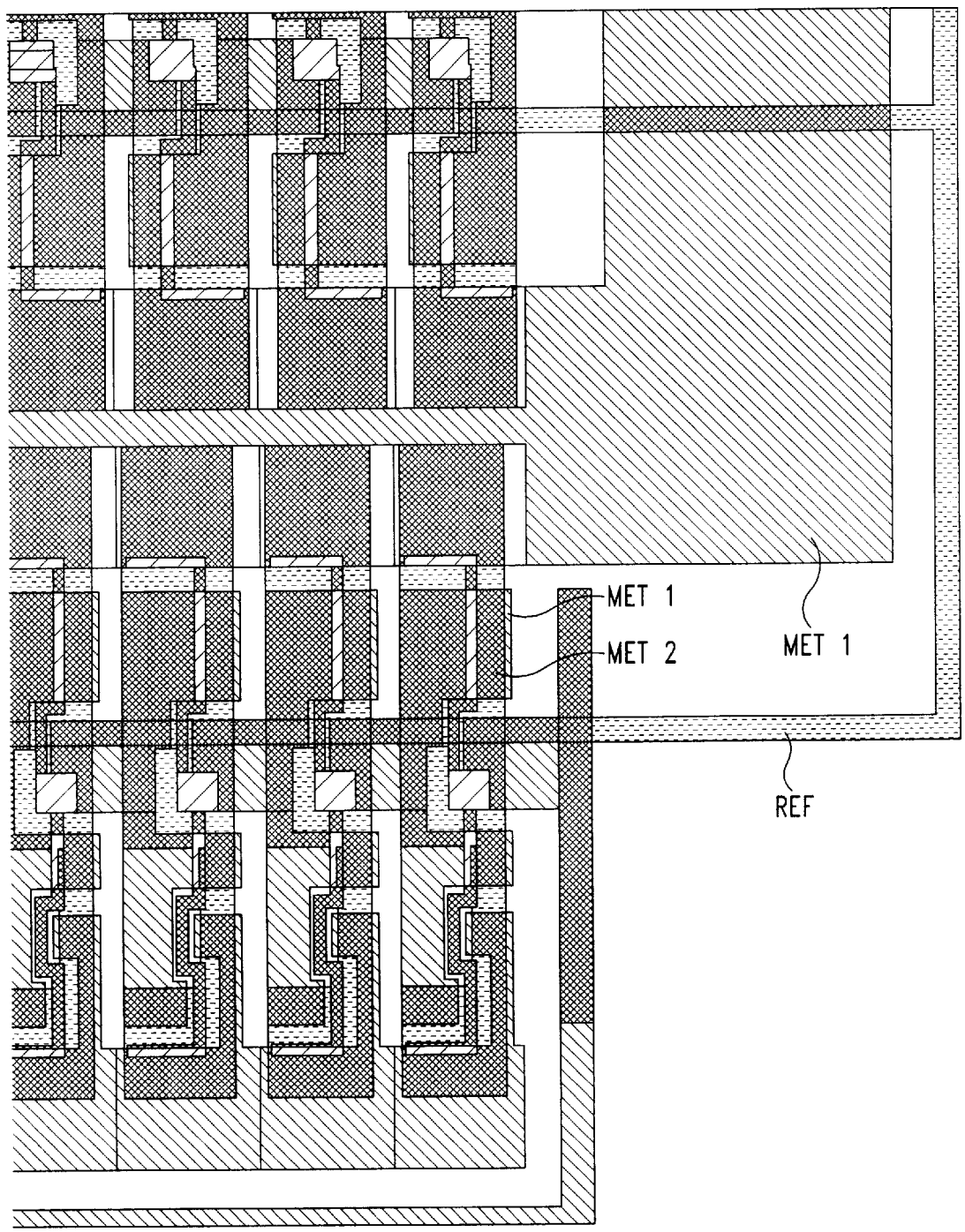
Figure 10:
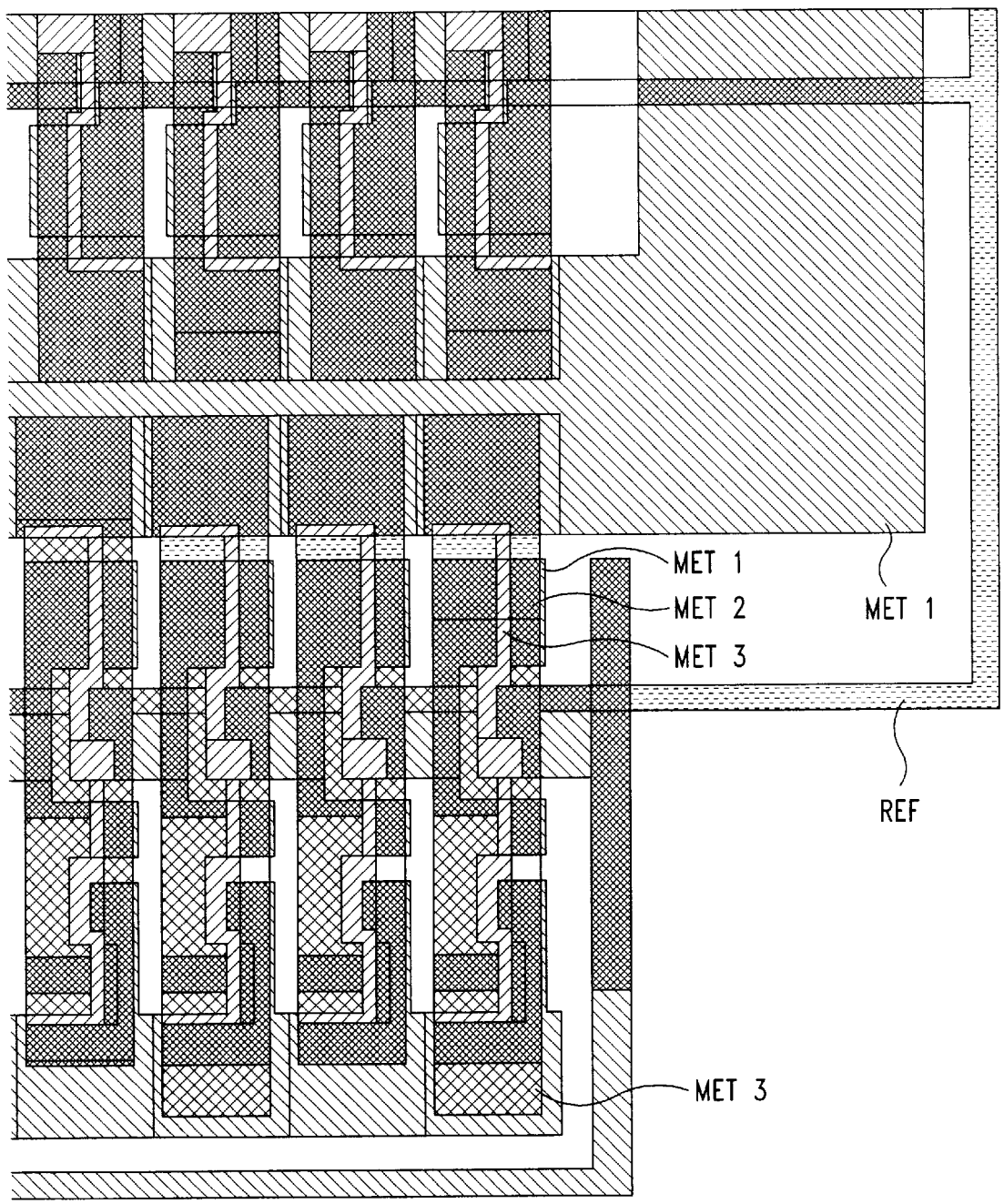

The metallization areas relating to a portion of the layout of FIG. 6 are shown in FIGS. 8, 9 and 10 as they appear at three successive stages of the processing of the integrated circuit. FIG. 8 shows the areas formed by the first met1allization level MET, FIG. 9 also shows the areas formed by the second metallization level MET2, and FIG. 10 also shows the areas formed by the third metallization level MET3. Areas formed by MET1 are each in contact with the drain terminals of the two transistors of a delay cell and each forms, with an area formed by MET2, the capacitor C1-2 of a corresponding pair of capacitors Ci. The track REF is also formed by MET2. Areas formed by MET3 are in contact with corresponding areas formed by MET1 via respective connections between levels and each forms, with an area formed by MET2, the capacitor C3-2 of a corresponding pair of capacitors Ci.

As can be seen in FIG. 10, the superimposed areas of the metallization layers MET3 and MET2 are different for different cells INV-i so that the capacitors C32 also differ from one another. Naturally, it is not essential for every capacitor C3-2 to be different from all of the other capacitors C3-2; it is important, however, that there be sufficient different capacitances to cause the generation of irregular pulses at the terminal REF and hence the injection into the oscillator OSC-2 of a noise substantially without harmonic components.

Although only a few embodiments of the invention have been described and illustrated, clearly, many variations and modifications are possible within the scope of the same inventive concept. For example, the noise generator could be any generator of white noise, that is, noise substantially without harmonics. The variable impedance which determines the frequency of the oscillator could be provided in only one branch of the multivibrator instead of in both. The multivibrator could be formed with MOS transistors or by mixed bipolar-MOS technology instead of solely with bipolar transistors, and the interference oscillator could be a loop oscillator instead of an astable multivibrator.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit comprising first and second phase-locked loops, each with its own oscillator, and a noise generator coupled to means for determining the frequency of the oscillator of the first phase-locked loop and means for activating the noise generator when the second phase-locked loop is in operation.

2. An integrated circuit according to claim 1 wherein the oscillator of the first phase-locked loop, to which the noise generator is coupled, comprises an astable multivibrator having two circuit branches with respective cross-coupled transistors, the means for determining its frequency including a variable impedance in series with at least one circuit branch of the multivibrator.

3. An integrated circuit according to claim 2 wherein the cross-coupled transistors comprise bipolar transistors having emitters coupled to one another by a capacitor.

4. An integrated circuit according to claim 1 wherein the noise generator comprises a loop oscillator formed by a plurality of delay cells connected in cascade and a plurality of capacitive structures each connected between the output of a delay cell and the oscillator of the first phase-locked loop.

5. An integrated circuit according to claim 4 wherein each delay cell comprises an inverter.

6. An integrated circuit according to claim 4 wherein at least some of the capacitive structures have different capacitances.

7. An integrated circuit according to claim 4 wherein the capacitive structures each comprise three metallic layers superimposed and insulated from one another.

8. A reading and writing device of a data-storage disk unit comprising an integrated circuit according to claim 1.

9. An integrated circuit for recovering data from a read head in a memory storage device, data being read from the memory storage device during selected discrete periods of time separated by periods of time when data is not being read from the memory storage device, the circuit comprising:

a data recovery circuit coupled to receive a read head signal from the read head and structured to generate a data signal at an output based on the read head signal;

a first circuit having a first oscillator and being coupled through a switch to receive the read head signal, the first circuit being structured to generate a sampling signal based on the read head signal, the sampling signal being coupled to the data recovery circuit;

a second circuit having a second oscillator coupled through the switch to the first circuit, the second circuit being structured to generate a tuning signal, the first circuit being coupled through the switch to receive the read head signal when data is being read and to receive the tuning signal when data is not being read; and a noise generating circuit coupled to the second circuit and structured to generate a noise signal, the second circuit receiving the noise signal when data is being read and the first circuit is coupled to receive the read head signal.

10. The circuit of claim 9 wherein the noise generating circuit comprises a loop oscillator circuit having an output coupled to the second circuit.

11. The circuit of claim 10 wherein the loop oscillator comprises a plurality of delay cells connected in cascade and a plurality of capacitive structures connected between respective delay cells and the second oscillator.

12. The circuit of claim 11 wherein the capacitive structures comprise capacitors having varying capacitance values.

13. The circuit of claim 11 wherein each of the delay cells comprises an inverter circuit.

14. The circuit of claim 9, further comprising a timing circuit having an output coupled to the switch and to an enabling input of the noise generating circuit, the timing circuit being structured to generate a first timing signal to enable the noise generating circuit and to couple the switch to receive the read head signal and being structured to alternately generate a second timing signal to disable the noise generating circuit and couple the switch to the second circuit to receive the tuning signal.

15. The circuit of claim 9 wherein the second oscillator comprises an astable multivibrator.

16. The circuit of claim 9 wherein the first and second circuits comprise respective phase-locked loops.

17. A method for preventing injection lock in an integrated circuit for recovering data from a read head in a memory storage device, the method comprising:

reading data from a memory storage device during selected discrete periods of time separated by periods of time when data is not being read from the memory storage device;

generating a read head signal representing the data when the data is being read;

generating a sampling signal based on the read head signal in a circuit having a first oscillator when the data is being read;

generating a data signal from the read head signal synchronized with the sampling signal when the data is being read;

generating a tuning signal in a circuit with a second oscillator when the data is not being read;

coupling the tuning signal to the circuit having the first oscillator when the data is not being read;

generating a noise signal; and coupling the noise signal to the second oscillator when the data is being read and the data signal is being generated.

18. The method of claim 17 wherein the step of generating a noise signal comprises generating a noise signal in a loop oscillator circuit when the data is being read.

19. The method of claim 17, further comprising disabling the first oscillator when the tuning signal is being generated and the data is not being read.

20. The method of claim 17 wherein the step of generating a sampling signal comprises generating a digital sampling signal based on samples of an analog read head signal when the data is being read and wherein the step of generating a data signal comprises generating a digital data signal based on the analog read head signal and synchronous with the sampling signal when the data is being read.

* * * * *